United States Patent
Berkovitch et al.

(10) Patent No.: US 11,435,733 B2
(45) Date of Patent: Sep. 6, 2022

(54) METHOD AND SYSTEM TO ASSURE MONITORING SYSTEM VALIDITY

(71) Applicants: Shlomo Berkovitch, Raanana (IL); Yaron Kaufmann, Tel Aviv (IL)

(72) Inventors: Shlomo Berkovitch, Raanana (IL); Yaron Kaufmann, Tel Aviv (IL)

(73) Assignee: CartaSense Ltd., Petach Tikva (IL)

( * ) Notice: Subject to any disclaimer, the term of this patent is extended or adjusted under 35 U.S.C. 154(b) by 703 days.

(21) Appl. No.: 16/183,798

(22) Filed: Nov. 8, 2018

(65) Prior Publication Data

US 2019/0196459 A1 Jun. 27, 2019

Related U.S. Application Data

(60) Provisional application No. 62/583,031, filed on Nov. 8, 2017.

(51) Int. Cl.
*G05B 23/02* (2006.01)
*G01R 31/3181* (2006.01)
*G01R 31/3183* (2006.01)
*G06F 11/263* (2006.01)

(52) U.S. Cl.
CPC ....... *G05B 23/024* (2013.01); *G05B 23/0221* (2013.01); *G05B 23/0281* (2013.01); *G01R 31/3183* (2013.01); *G01R 31/31813* (2013.01); *G01R 31/318385* (2013.01); *G06F 11/263* (2013.01)

(58) Field of Classification Search
CPC ............. G05B 23/024; G05B 23/0221; G05B 23/0281; G01R 31/31813; G01R 31/3183; G01R 31/318385; G06F 11/263
See application file for complete search history.

(56) References Cited

U.S. PATENT DOCUMENTS

| | | | | |
|---|---|---|---|---|
| 5,570,300 | A | * 10/1996 | Henry | G01F 1/8436 374/E15.001 |
| 2012/0105201 | A1 | * 5/2012 | Sanders | G05B 15/02 340/5.83 |
| 2016/0301923 | A1 | * 10/2016 | Ichige | G06K 9/00798 |
| 2019/0033850 | A1 | * 1/2019 | B R | G05B 9/02 |
| 2020/0053353 | A1 | * 2/2020 | Mueller | B60R 11/04 |
| 2020/0364647 | A1 | * 11/2020 | Degen | G06Q 30/018 |

FOREIGN PATENT DOCUMENTS

WO WO-2017212464 A1 * 12/2017

* cited by examiner

*Primary Examiner* — John C Kuan
(74) *Attorney, Agent, or Firm* — Reches Patents

(57) ABSTRACT

There may be provided a method for validating a monitoring system, the method may include sensing, by at least one sensing element of the monitoring system, a physical parameter; sending sensed information that is related to the physical parameter to a remote computerized system of the monitoring system; applying, by the remote computerized system, a process on the sensed information to provide a response to the sensed information; generating validation information by a generator of the monitoring system; sending the validation information to the remote computerized system; applying, by the remote computerized system, the process on the validation information to provide a response to the validation information; and determining, by a validator of the monitoring system, a validity of the monitoring system based on the response to the validation result.

13 Claims, 4 Drawing Sheets

METHOD AND SYSTEM TO ASSURE MONITORING SYSTEM VALIDITY

CROSS REFERENCE

Figure 1:
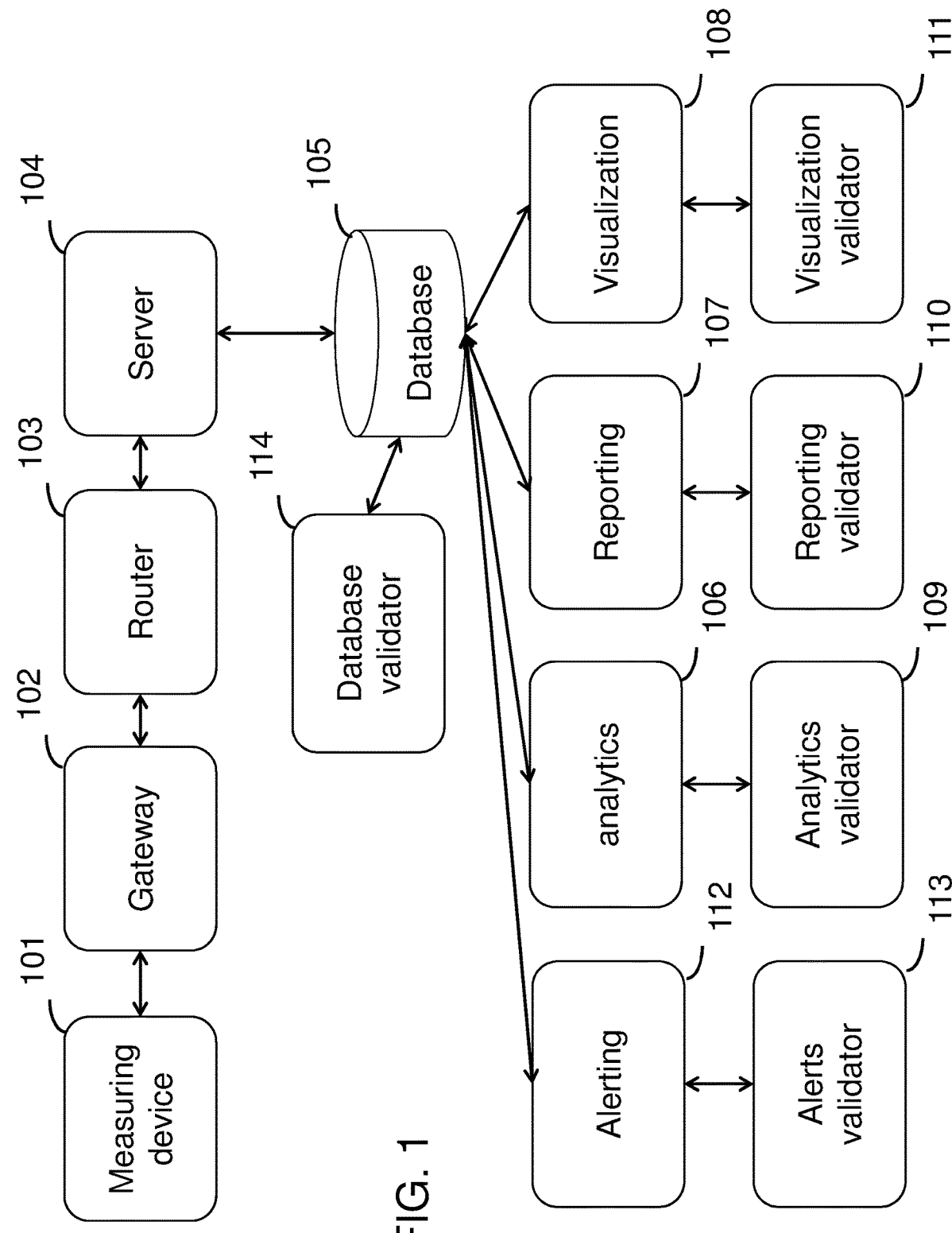

This application claims priority from US provisional patent Ser. No. 62/583,031 filing date Nov. 8, 2017.

FIELD OF INVENTION

The present disclosure relates to monitoring systems, where a validity of the monitoring system is of high importance. More specific it relates to wireless environmental and shipment monitoring systems, involving wireless measuring devices, access points, cloud computing and a user interface to view the measurements of a measuring device of the monitoring system.

BACKGROUND

Monitoring of environmental conditions is essential to many types of business. Especially it is important in the two major global markets of food and pharmaceuticals.

Global and regional regulations are driving the need for environmental condition monitoring for pharmaceutical. The regulatory landscape for food products is gradually following up, with the introduction of the food safety modernization act (FSMA) in the United States.

Many of the systems, used to monitor environmental and in-shipment conditions need to be validated. Validation is a process that methodologically assures that a certain process can be repeated with high certainty of success. In the monitoring case, this means that the monitoring system will give results that are consistently accurate.

As modern technology advances, there are two challenges to the validation process. First, it is a costly process, that takes relatively long time, so usually it is done only once, or once in a long time. Second, as more and more software is introduced into the monitoring system, both in the devices (measuring device and gateways) and in the main computing element, the cost and complexity of the validation process slows down the system upgrade.

The introduction of a device and methodology that is performing continuous validation of the system provides improved system performance, by reducing the down time and the need for manual labor and considerable savings.

In numerous applications, the validity of such measurements is crucial as it involves decision that affects human lives. This could be acceptance of pharmaceutical products shipments sensitive food and alike. In some cases the measurement data has effect on the value of the shipment, as deviation from ideal temperature humidity and other physical parameters of the shipment might shorten the shelf life of the product and hence it's value.

SUMMARY

There may be provided a monitoring system with embedded capabilities to validate the system performance. The monitoring system has an embedded capability to generate a sequence of data that can validate to be correct by all elements following a measuring device in a data chain between the measuring device and a remote computerized system.

There may be provided a method for validating a monitoring system, the method may include: sensing, by at least one sensing element of the monitoring system, a physical parameter; sending sensed information that is related to the physical parameter to a remote computerized system of the monitoring system; applying, by the remote computerized system, a process on the sensed information to provide a response to the sensed information; generating validation information by a generator of the monitoring system; sending the validation information to the remote computerized system; applying, by the remote computerized system, the process on the validation information to provide a response to the validation information; and determining, by a validator of the monitoring system, a validity of the monitoring system based on the response to the validation result.

There may be provided a method for validating a monitoring system, the method may include: sensing, by at least one sensing element of the monitoring system, a physical parameter; sending sensed information that is related to the physical parameter to a remote computerized system of the monitoring system; generating validation information by a generator of the monitoring system; sending the validation information to the remote computerized system; and wherein the validation information, once subjected to a process applied on the sensed information, is indicative of a validity of the monitoring system.

There may be provided a method for validating a monitoring system, the method may include: applying, by a remote computerized system of the monitoring system, a process on sensed information to provide a response to the sensed information; wherein the sensed information is indicative of a physical parameter sensed by at least one sensing element of the monitoring system; receiving validation information by the remote computerized system; applying, by the remote computerized system, the process on the validation information to provide a response to the validation information; and determining, by a validator of the monitoring system, a validity of the monitoring system based on the response to the validation result.

There may be provided a non-transitory computer readable medium that may store instructions for: sensing, by at least one sensing element of a monitoring system, a physical parameter; sending sensed information that is related to the physical parameter to a remote computerized system of the monitoring system; applying, by the remote computerized system, a process on the sensed information to provide a response to the sensed information; generating validation information by a generator of the monitoring system; sending the validation information to the remote computerized system; applying, by the remote computerized system, the process on the validation information to provide a response to the validation information; and determining, by a validator of the monitoring system, a validity of the monitoring system based on the response to the validation result.

There may be provided a non-transitory computer readable medium that may store instructions for applying, by a remote computerized system of a monitoring system, a process on sensed information to provide a response to the sensed information; wherein the sensed information is indicative of a physical parameter sensed by at least one sensing element of the monitoring system; receiving validation information by the remote computerized system; applying, by the remote computerized system, a process on the validation information to provide a response to the validation information; and determining, by a validator of the monitoring system, a validity of the monitoring system based on the response to the validation result.

There may be provided a non-transitory computer readable medium that may store instructions for sensing, by at least one sensing element of a monitoring system, a physical parameter; sending sensed information that is related to the physical parameter to a remote computerized system of the monitoring system; generating validation information by a generator of the monitoring system; sending the validation information to the remote computerized system; wherein the validation information, once subjected to a process applied on the sensed information, is indicative of a validity of the monitoring system.

BRIEF DESCRIPTION OF THE ACCOMPANYING DRAWINGS

Figure 2:
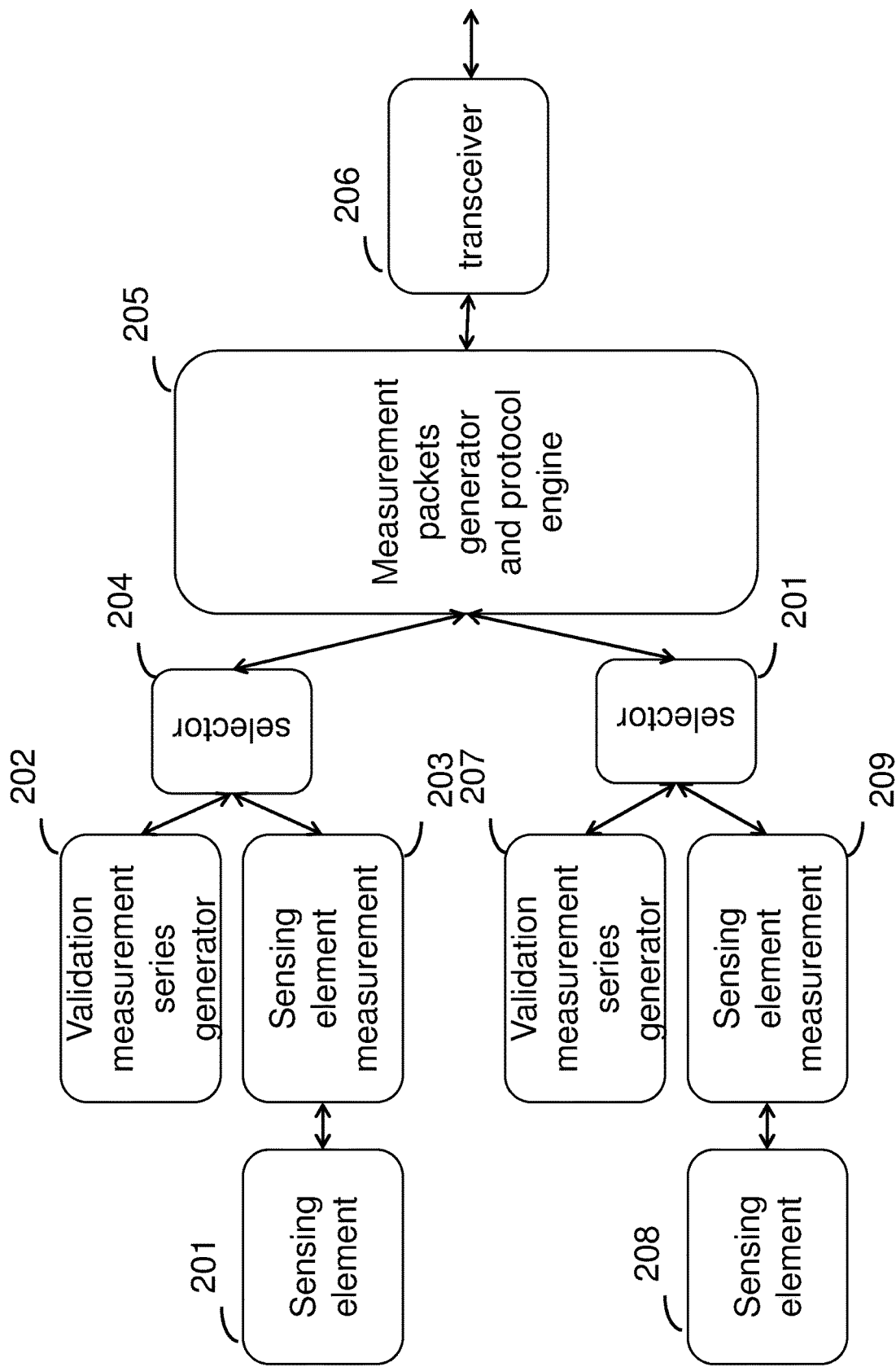
Figure 3:
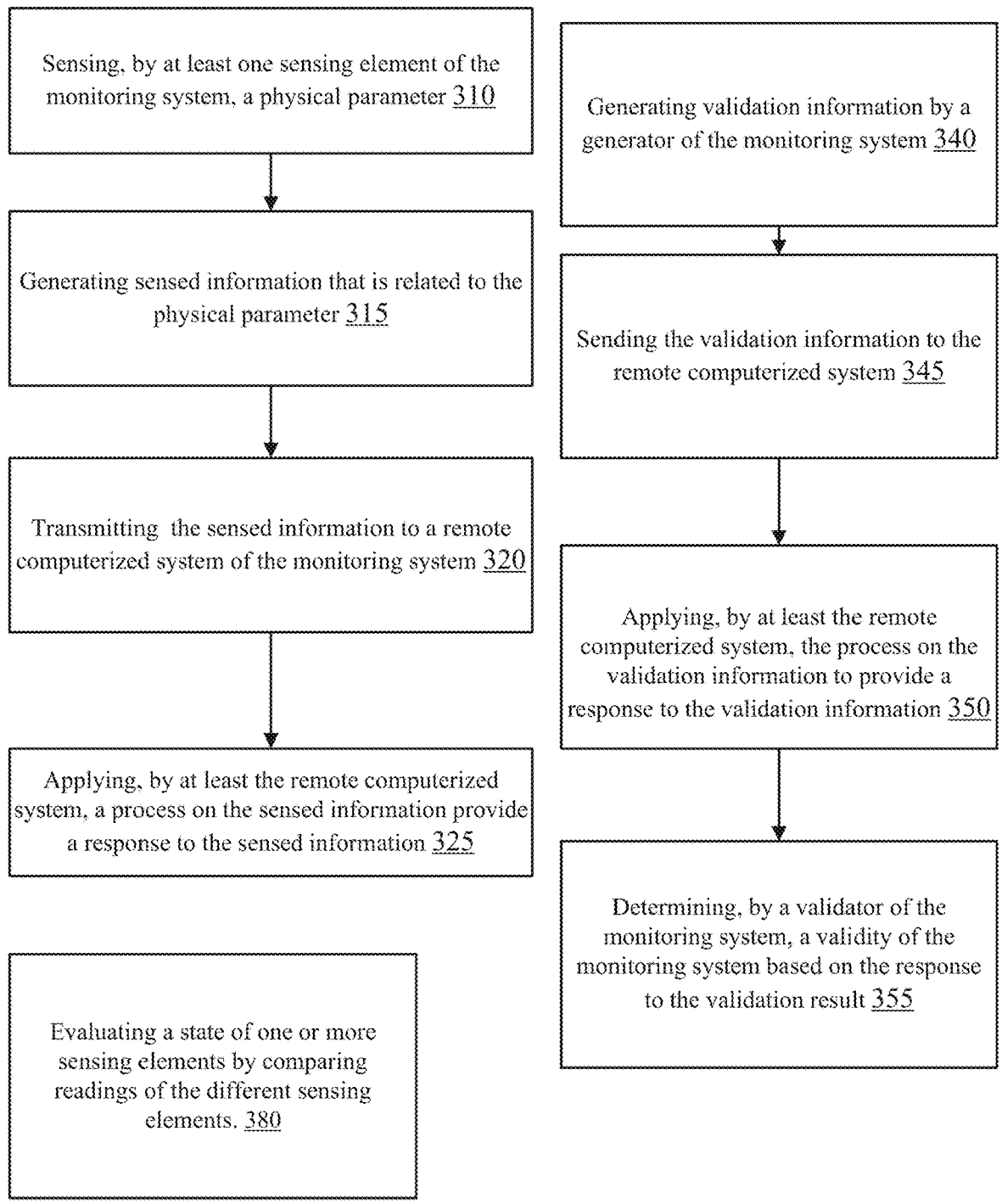
Figure 4:
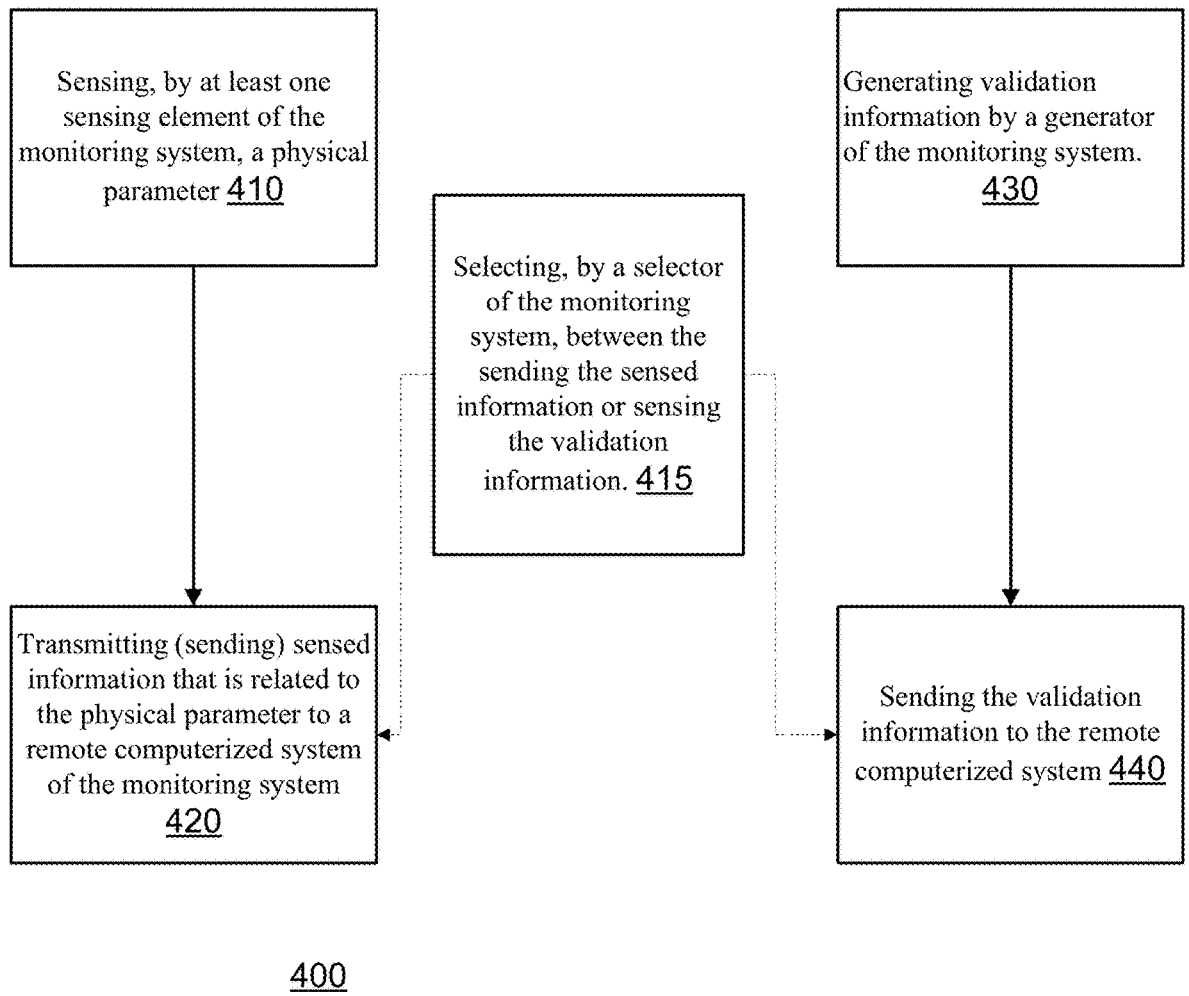

The foregoing summary of aspects, objectives, as well as the following detailed description of preferred embodiments, will be better understood when read in conjunction with the appended drawings. There is shown in the drawings some example embodiments, however, the application is not limited to the specific system and method disclosed in the drawings:

FIG. 1 illustrates an example of a monitoring system;
FIG. 2 illustrates an example of a monitoring system;
FIG. 3 illustrates an example of a method; and
FIG. 4 illustrates an example of a method.

DETAILED DESCRIPTION

Any reference to a system should be applied, mutatis mutandis to a method that is executed by a system and to a non-transitory computer medium that stores instruction executable by the system.

Any reference to a method should be applied, mutatis mutandis to a system that is configured to execute the method and to a non-transitory computer medium that stores instruction for executing the method.

Any reference to a non-transitory computer medium that stores instruction should be applied, mutatis mutandis to a system that is configured to execute the instructions and to a method that is performed when executing the instructions.

The terms "transmit" and "send" are used in an interchangeable manner.

The terms "configured" and "constructed and arranged" are used in an interchangeable manner.

The term "and/or" is additionally or alternatively.

A monitoring system may be required to deliver accurate and reliable measurements of one or more physical parameters. There is a wide range of physical parameters that may be monitored, some may be specific for different industries. Those parameters could be temperature for pharmaceuticals, temperature and humidity for fresh produce, grain pile height for silos, shock and vibration for sensitive equipment and many others physical parameters.

While the accuracy of the monitoring devices is tested regularly at intervals dictated by regulations or by common practices the validation of a system is done only once, or in very few occasions. The sparsity of the monitoring system validations stems for the high amount of work needed, especially where software is involved, as there are many aspects to the software use. Using the new proposed end to end method allows quick validation after software changes and system level validation on a regular basis.

Traditional system validation can be broken down to three phases: IQ—Installation qualification, OQ—operation qualification, PQ—performance qualification. When it comes to software based systems, the latter two phases are the most burdensome. Employing a monitoring device with built in system validation features drastically reduces the time and effort involved with OQ and PQ.

The monitoring device can be one of three types: (1) monitoring only, (2) monitoring and validation series generation (3) validation series only. We will describe the operation of device of type (2) as type (1) is a regular device and type (3) is a subset of device of type (2).

There may be provided a monitoring system that has a chain of devices and connectivity that allows measuring a physical quality and transferring the measurement from one or more sensing elements of the measuring device to the measuring element and through several processing devices like gateways (102) routers (103) and servers (104) to a storage element like a database (105) and further to a reporting (107), visualization (108) and analytics (106) elements.

The monitoring device may include a plurality of sensor elements (201 and 208 as an example) that are configured to monitor several physical parameters (such as environmental parameters) of one or more objects such as but not limited to a package. Those physical parameters can be, but not limited to, temperature, humidity, shock, tilt, vibrations and others.

The monitoring device may include a plurality of measuring blocks (203 and 209 as an example) that are configured to translate the physical parameter of the sensing element, depending on the measured physical parameter to an electrical signal being voltage, current or a number presentation There may be provided a plurality of selectors (204 and 201 as an example) that are configured to select, per sensing element the output of a validation measurement series generator (202 and 207 as an example).

There may be provided a measurement packet generator and protocol engine (205) that are configured to receive the output of the selectors (202 and 207) and feed a protocol compliant data to a transceiver (206).

There may be provided validation measurement series generators (202,207) that are configured to generate a series of measurement that validates the complete system. This series can be, but not limited to, constant, a correlated series or a pseudo random measurement generator that minimizes the probability that the system can transfer these series while not functioning in the right manner.

There may be provided validators (109,110,111,113,114) that may be connected to the respective elements of visualization (108), reporting (107) analytics (106) and the database storage element (105)

The validators (109,110,111,113) may be configured to detect the special validation series generated by the validation measurement series generators (202,207) by detecting a special pattern, special correlation or relying on other auxiliary information.

When a validator detects a defected validation series, the validator may send an alert via e-mail, SMS or other instant messaging means to the responsible person.

The suggested monitoring system may provide at least the following benefits:

a. Data is consistent all across the monitoring system.
b. Data is complete.
c. Automatic reports are accurate.
d. No impact by software changes.
e. No impact by data route (Wireless vs Ethernet).
f. No impact by firewall and other data security solutions.

A monitoring device may generate a series of measurements that can be validated by visual and computerized methods. As the validators are not changing, the automatic validation is reliable and dependable.

FIG. 1 illustrates an example of a monitoring system. Connectivity between the blocks can be wither wired or wireless.

In FIG. 1 the monitoring system is illustrated as including a wireless measuring device (101) that is configured to measure a physical parameter such as but not limited to the temperature in a refrigerator where pharmaceutical products are stored. This refrigerator could be one of several refrigerators in a drugstore, holding various types of pharmaceutical products.

The measuring device (101) may be configured sending the measurements to a gateway (102) using a wireless protocol like WiFi, Zigbee or other. The gateway (102) is acting as a concentrator for all measuring devices (101) and sends the concentrated measurements to a local area network like Ethernet. A router (103) further sends the concentrated measurements to the wide area network (WAN) and to a server (104) that stores all the measurements in a database (105). Typical use cases of such monitoring system is to visualize the measurement (108), create reports based on measured data (107), provide analytics (like predictions and trends) (106) or generate alerts (112). An example of a type (2) measuring device can be seen in FIG. 2. The device contains sensing elements (201,208) that translates a physical parameter like temperature, humidity, pressure etc. to an electrically measurable parameter like resistance, voltage, capacitance, inductance, mutual inductance etc. A sensing element measurement block (203,209) is performing the conversion from the electrically measurable parameter to a digital representation of this parameter that will be further conveyed to the protocol engine (205) through a selector (204,201).

It should be noted that although the previous text and the following text refer to a physical parameter, that the monitoring system may measure multiple physical parameters, and that the number of sensing elements per measuring device may exceed two.

The monitoring system may be configured to direct connection to a WAN from the measuring device (101). The measuring device may be connected to the WAN with cellular or other wireless WAN technology (like LoraWAN, Sigfox, weightless and alike). The gateway (102) being a cellular base station and the routing and server access provided by the cellular operator network.

The output of the validation series measurement generator (202,207) may be fed to the protocol engine (205).

The validation series can be very trivial—like a series of identical measurements or more complex as the validation requires establishing documented evidence which provides a high degree of assurance that a specific process will consistently produce a product meeting its predetermined specifications and quality attributes.

One example of a validation series can be measurements with increasing value from minimum value to maximum value (saw tooth waveform) that spans all possible measurement values. This type of series allows to detect "missing values" and easily test a threshold based alert.

Another example can be a pseudo random series. The seed of the series can be a default, a unique number like the measuring device serial number or a number delivered to the measuring device via the gateway (102). Another example can be measurements covering a complete time period that generates a report that easily highlights any deviation.

Another example can be an encrypted measurement series that eliminates the susceptibility for man in the middle attacks.

The validators (109,110,111,113) may perform the validation with or without human intervention, may be computerized entities. The validators can be human. The validators may be configured to verify the integrity of the validation measurement series by looking at a reference series presentation and also looking for gaps (missing measurements).

Computerized (machine based) validators can look for more complex qualities of the validation series, like autocorrelation, spectral content, gaps, authenticity and more.

In case of visualization validation, the machine based validators may be configured to grab a screenshot of the visualization and analyze it according the validation measurement series.

For alert validation, a validator may be configured to grab the alerts going out to the user and analyze the content to verify the alert has been sent at the right time with the right alert cause.

There may be provided a device capable of sending a validation series of data for determining the validity of a complete measurement and analysis system. The device may include validation series generator; and a protocol engine and a transceiver for connecting to a network.

The monitoring system may include hardware components such as computers, processors including but not limited to central processing units (CPU), and/or one or more other integrated circuits such as application-specific integrated circuits (ASICs), field programmable gate arrays (FPGAs), full-custom integrated circuits, etc., and the like.

FIG. 3 illustrates an example of a method 300.

Method 300 may be executed for validating a monitoring system.

Method 300 may include step 310 of sensing, by at least one sensing element of the monitoring system, a physical parameter. Step 310 may be executed, for example, by measuring device 101 of FIG. 1, and especially by sensing elements 201 and 208 of FIG. 2.

Step 310 may be followed by step of 315 of generating sensed information that is related to the physical parameter. Step 315 may be executed, for example, by measuring device 101 of FIG. 1 and especially by measuring blocks 203 and 209 of FIG. 2.

Step 315 may be followed by step 320 of transmitting (for example by at least transceiver 206 of FIG. 2) the sensed information to a remote computerized system of the monitoring system. The sensed information may pass through entities such as but not limited to transceiver 206 of FIG. 2, gateway 102 and router 103 of FIG. 1.

Step 320 may be followed by step 325 of applying, by at least the remote computerized system, a process on the sensed information provide a response to the sensed information. The process may include, for example, generating reports, estimating future values of the physical parameter visualizing the sensed information, and the like. The process may also include any pre-processing applied by communication components or any intermediate components through which the sensed information passes. The remote computerized system may include, for example, alerting module 112, analytics module 106, reporting module 107 and visualization module 108.

During a sending of the sensed information and a receiving of the sensed information (by the remote computerized system) the sensed information is preprocessed (for example—applying any operation related to the transmission and/or storing of the sensed information). During a sending of the validation information and the receiving of the validation information by the remote computerized system) the validation information may be preprocessed at a same manner as the sensed information.

The same processing and the same preprocessing of the sensed information and the validation information assist in determining the validation of the monitoring system (and the validity of the sensed information) based on the validation information.

Method 300 may include step 340 of generating validation information by a generator of the monitoring system. Step 340 may be executed, for example, by measuring device 101 of FIG. 1 and especially by blocks 203 and 209 of FIG. 2.

Step 340 may be followed by step 345 of sending the validation information to the remote computerized system. This may be executed by transceiver 206 of FIG. 2.

Step 345 may be followed by step 350 of applying, by at least the remote computerized system, the process on the validation information to provide a response to the validation information. The process of step 350 is preferably the same process that was applied during step 325. Any differences (if such exist) between the process applied during step 325 and the process applied during step 350 may be insignificant in the sense that the validation information will provide a reliable indication of the state of the monitoring system. Especially—a properly operating monitoring system will output a proper validation information and a defective monitoring system will provide an invalid or improper validation information.

Step 350 may be followed by step 355 of determining, by a validator of the monitoring system, a validity of the monitoring system based on the response to the validation result. Step 355 may be executed by validators such as alerts validator 113, analytics validator 109, reporting validator 110 and visualization validator 111 for validating alerting module 112, analytics module 106, reporting module 107 and visualization module 108, respectively.

The validation information may include a validation pattern of at least one valid measurement value, wherein the validation pattern exhibits a predefined character; and wherein the determining of the validity of the monitoring system may include searching for the predefined character.

The validation pattern may consist essentially of a single valid measurement value.

The validation pattern may include multiple valid measurement values.

The validation pattern may be a pseudo random pattern.

The validation pattern may include multiple valid measurement values that range between a minimal valid measurement value and a maximal valid measurement value.

The validation pattern may include sequences of monotonically changing valid measurement values.

The validation pattern may be a saw tooth pattern.

To allow the validators to differentiate between sensed information and validation information the validation pattern may differ from an expected pattern formed by a sequence of measurements represented by the sensed information. The expected pattern may be obtained during periods in which it is known that the monitoring system properly operates.

The validation pattern may differ from the expected pattern by a rate of change. For example—the validation pattern may represent rapid temperature changes that are not feasible and are not supposed to be generated even by a defective sensing element.

The predefined character may be related to autocorrelation between valid measurement values of the validation pattern.

The validation pattern may be encrypted. Method 300 may include encrypting the validation pattern before the transmission of the validation pattern and decrypting the validation pattern by the remote computerized system.

The method may include selecting, by a selector of the monitoring system, between the transmission of the sensed information and the transmission of the validation information. Accordingly—method 300 may include one or more iterations of (a) group of steps 310, 315 and 320, and (b) group of steps 340 and 345.

The selecting may be executed in a random or pseudo random manner.

The selecting may be executed in a non-random manner.

The method may include formatting the sensed information at a same format as the validation information. The formatting may be executed prior to the transmission of the respective information to the remote computerized system.

The remote computerized system (especially the parts that apply the process) may or may not be aware when it receives sensed information and when it receives the validation information.

Steps 340 may be triggered in various manners. For example—it may be triggered in a repetitive manner, in a random manner, in a pseudo random number and the like. The triggering may be executed by a controller of the monitoring system. The repetition period may be short enough not to skip software updates—for example the repetition period may range between 1 minute and several days or several weeks.

Step 340 may be triggered automatically after software or other updates. For example—step 340 may be triggered following an indication related to an update related to the process.

The physical parameter may be selected, for example, out of temperature, humidity, shock, tilt and vibrations. Any other physical parameter may be measured.

The at least sensing element may include multiple sensing elements and method 300 may include step 380 of evaluating a state of one or more sensing elements by comparing readings of the different sensing elements. Step 380 may include flagging a sensing element that generated readings that deviates (for example—for at least a predefined amount during a predefined period) from the readings of other sensing elements.

FIG. 4 illustrates method 400 for validating a monitoring system, the method may include:

Step 410 of sensing, by at least one sensing element of the monitoring system, a physical parameter.

Step 420 of transmitting (sending) sensed information that is related to the physical parameter to a remote computerized system of the monitoring system.

Step 430 of generating validation information by a generator of the monitoring system.

Step 440 of sending the validation information to the remote computerized system. The validation information, once subjected to a process applied on the sensed information, is indicative of a validity of the monitoring system.

The validation information may include a validation pattern of at least one valid measurement value, wherein the validation pattern exhibits a predefined character.

Method 400 may include step 415 of selecting, by a selector of the monitoring system, between the transmission of the sensed information and the transmission of the validation information.

Accordingly—method 400 may include one or more iterations of steps 410 and 420 as well as steps 430 and 440.

The selecting may be executed in a random or pseudo random manner.

The selecting may be executed in a non-random manner.

The selecting is merely a non-limiting example for determining when to transmit the sensed information and when to transmit the validation information. For example—the sensed information and the validation information may be transmitted in parallel to each other, it should be noted that no selection may be applied.

The method may include formatting the sensed information at a same format as the validation information.

The method may include triggering the generation of the validation information following an indication related to an update related to the process.

The physical parameter is selected out of temperature, humidity, shock, tilt and vibrations.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

The phrase "may be X" indicates that condition X may be fulfilled. This phrase also suggests that condition X may not be fulfilled. For example—any reference to a system as including a certain component should also cover the scenario in which the system does not include the certain component. For example—any reference to a method as including a certain step should also cover the scenario in which the method does not include the certain component. Yet for another example—any reference to a system that is configured to perform a certain operation should also cover the scenario in which the system is not configured to perform the certain operation.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the system and the mobile computer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

Any system, apparatus or device referred to this patent application includes at least one hardware component.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any combination of any component of any component and/or unit of system that is illustrated in any of the figures and/or specification and/or the claims may be provided.

Any combination of any system illustrated in any of the figures and/or specification and/or the claims may be provided.

Any combination of steps, operations and/or methods illustrated in any of the figures and/or specification and/or the claims may be provided.

We claim:

1. A method for validating a monitoring system, the method comprises:
    sensing, by at least one sensing element of the monitoring system, a physical parameter;
    sending sensed information that is related to the physical parameter to a remote computerized system of the monitoring system;
    generating validation information by a generator of the monitoring system;
    sending the validation information to the remote computerized system; wherein the validation information, once subjected to a process applied on the sensed information, is indicative of a validity of the monitoring system; wherein the validation information comprises a validation pattern of at least one valid measurement value, wherein the validation pattern exhibits a predefined character that is related to autocorrelation between valid measurement values of the validation pattern; and determining, by the remote computerized system, the validity of the monitoring system; wherein the determining comprises searching for the predefined character.

2. The method according to claim 1 wherein the validation pattern comprises multiple valid measurement values.

3. The method according to claim 1 wherein the validation pattern comprises multiple valid measurement values that range between a minimal valid measurement value and a maximal valid measurement value.

4. The method according to claim 3 wherein the validation pattern comprises sequences of monotonically changing valid measurement values.

5. The method according to claim 1 wherein the validation pattern is encrypted.

6. The method according to claim 1 comprising selecting, by a selector of the monitoring system, between the sending of the sensed information and the sending of the validation information.

7. The method according to claim 6 wherein the selecting is executed in a random or pseudo random manner.

8. The method according to claim 6 wherein the selecting is executed in a non-random manner.

9. The method according to claim 1 comprising formatting the sensed information at a same format as the validation information.

10. The method according to claim 1 comprising triggering the generation of the validation information following an indication related to an update related to the process.

11. The method according to claim 1 wherein the physical parameter is selected out of temperature, humidity, shock, tilt and vibrations.

12. A method for validating a monitoring system, the method comprises:

sensing, by at least one sensing element of the monitoring system, a physical parameter;

sending sensed information that is related to the physical parameter to a remote computerized system of the monitoring system;

generating validation information by a generator of the monitoring system;

sending the validation information to the remote computerized system; wherein the validation information, once subjected to a process applied on the sensed information, is indicative of a validity of the monitoring system;

wherein the validation information comprises a validation pattern of at least one valid measurement value, wherein the validation pattern comprises multiple valid measurement values that range between a minimal valid measurement value and a maximal valid measurement value, wherein the validation pattern comprises sequences of monotonically changing valid measurement values, wherein the validation pattern exhibits a predefined character that is a saw tooth pattern; and determining, by the remote computerized system, the validity of the monitoring system; wherein the determining comprises searching for the predefined character.

13. A non-transitory computer readable medium that stores instructions for:

sensing, by at least one sensing element of a monitoring system, a physical parameter;

sending sensed information that is related to the physical parameter to a remote computerized system of the monitoring system;

generating validation information by a generator of the monitoring system; and sending the validation information to the remote computerized system;

wherein the validation information, once subjected to a process applied on the sensed information, is indicative of a validity of the monitoring system; wherein the validation information comprises a validation pattern of at least one valid measurement value, wherein the validation pattern exhibits a predefined character that is related to autocorrelation between valid measurement values of the validation pattern; and determining, by the remote computerized system, the validity of the monitoring system; wherein the determining comprises searching for the predefined character.

* * * * *